United States Patent [19]

Ubukata

[11] 4,219,110
[45] Aug. 26, 1980

[54] WAFER PROBE APPARATUS WITH PNEUMATIC WAFER ORIENTING MECHANISM

[76] Inventor: Hirohiko Ubukata, 1-6-828, Oshima 1-chome, Koto-ku, Tokyo, Japan

[21] Appl. No.: 928,711

[22] Filed: Jul. 27, 1978

[30] Foreign Application Priority Data

Sep. 8, 1977 [JP] Japan .................................. 52-108076
Sep. 8, 1977 [JP] Japan .................................. 52-108077

[51] Int. Cl.² ............................................ B65G 47/24
[52] U.S. Cl. ...................................... 198/380; 406/87
[58] Field of Search ............... 198/380, 394; 414/676, 414/755; 406/72, 87, 88

[56] References Cited

U.S. PATENT DOCUMENTS

| 3,890,508 | 6/1975 | Sharp | 406/87 X |
| 3,930,684 | 1/1976 | Lasch et al. | 198/380 X |
| 3,982,627 | 9/1976 | Isdhata | 406/87 X |
| 4,024,944 | 5/1977 | Adams et al. | 406/87 X |

OTHER PUBLICATIONS

IBM Technical Disclosure Bulletin, vol. 18, No. 6, Nov. 1975, pp. 1865–1866, "Wafer Chuck Air Flow", Gruber et al.

Primary Examiner—Jeffrey V. Nase
Attorney, Agent, or Firm—Woodcock, Washburn, Kurtz, Mackiewicz & Norris

[57] ABSTRACT

For properly orienting, or setting in a predetermined angular position, a semiconductor wafer on a table on which integrated circuits or the like produced within and upon the wafer are tested with probes, the wafer is buoyed up from the table by a gas under pressure applied thereto from openings formed in the table and is further revolved substantially about its own axis, also by the application of the gas under pressure from a nozzle disposed above the table. A plurality of LED-phototransistor combinations sense the wafer orientation from the angular position of an orientation recess formed in the wafer, causing closure of solenoid valves to terminate the application of the gas under pressure when the wafer is properly oriented on the table. In another embodiment, the wafer is buoyed up and revolved by the gas under pressure emitted only from openings in the table.

14 Claims, 9 Drawing Figures

WAFER PROBE APPARATUS WITH PNEUMATIC WAFER ORIENTING MECHANISM

BACKGROUND OF THE INVENTION

1. Field of the Invention

My invention relates to wafer probers, that is, apparatus for testing integrated circuits or electronic devices such as transistors and diodes which have been fabricated within and upon semiconductor wafers or thin slices of semiconductor material. More specifically, my invention deals with improved means for correctly orienting, or setting in a predetermined angular position, successive wafers on the table or turntable of the wafer prober prior to the testing thereof.

2. Description of the Prior Art

In wafer probers of the type under consideration, successive semiconductor wafers to be tested are loaded one at a time on the table which is both rotatable and movable linearly in any of three different directions each perpendicular to the other two. The wafer is tested by means of probes which are relatively moved into contact with preselected electrodes on the wafer. For establishing proper contact between the probes and the preselected electrodes on the wafer, the position of the latter must be precisely adjusted relative to the probes as by use of a microscope. This fine adjustment of the wafer position can be greatly facilitated if the wafer is previously properly oriented or set approximately in a predetermined angular position relative to the probes.

It has been suggested and practiced to so orient the successive wafers before they are loaded on the table. Each wafer has formed therein what is herein termed an orientation recess designed to facilitate such preliminary orientation. This conventional practice is objectionable, however, in that the wafers, once properly oriented, are very likely to suffer angular displacement by the time they are mounted in position on the table. Another objection is that the wafers are susceptible to warpage or other damage as they are oriented by means which are forced into direct contact therewith.

SUMMARY OF THE INVENTION

It is an object of my invention to provide an improved wafer prober so made that successive semiconductor wafers to be tested can be correctly oriented on the table itself, instead of being oriented before being loaded thereon, thereby facilitating the subsequent fine adjustment of the wafer position relative to the probes.

Another object of my invention is to attain the first recited object in such a way that hardly any stress is exerted on the wafers.

A further object of my invention is to provide a wafer prober so made that wafers can be successively loaded on the table, correctly oriented thereon and unloaded therefrom through a process which lends itself to ready automation.

With these and other objects in view, my invention provides, in a wafer prober of the type in question, the improvement comprising a table on which wafers to be tested are loaded one at a time, means for stopping and holding the loaded wafer in a predetermined position on the table, means for revolving the loaded wafer substantially about its own axis relative to the table by application of a gas (e.g., air or nitrogen) under pressure, and means for sensing the fact that an orientation recess in the wafer is turned to a predetermined angular position on the table. The sensing means is operatively associated with the revolving means for causing the latter to terminate the application of the gas under pressure to the wafer when the orientation recess therein is turned to the predetermined angular position on the table. Also included are means operatively associated with the sensing means for adhering the wafer to the table by suction when the orientation recess in the wafer is turned to the predetermined angular position on the table.

Preferably, the table has formed therein a plurality of small-diameter openings through which the gas under pressire is applied to the loaded wafer for buoying up same from the table surface. While being thus held buoyed up, the wafer is revolved substantially about its own axis by the gas under pressure further applied thereto from a nozzle disposed above the table. Alternatively, the table openings can be so formed that the wafer is both buoyed up and revolved by the gas under pressure discharged therethrough. Either way, the wafer can be revolved with no means in forced contact therewith.

The fact that the orientation recess in the revolving wafer is turned to the predetermined angular position on the table is preferably sensed photoelectrically, as by means comprising a plurality of light sources such a light emitting diodes and a corresponding number of photodetectors such as phototransistors. As will become apparent from the following description of preferred embodiments, the photoelectric sensing means is capable of accurately sensing the wafer orientation, without in any way contacting the wafer in so doing.

The aforesaid openings in the table are further utilized to adhere the properly oriented wafer to the table, by exerting suction on the wafer through the table openings. It is thus seen that the correct orientation of the wafer is established on the table in a manner well calculated to minimize the stress applied to the wafer. Further, once properly oriented on the table, the wafer can be immediately adhered thereto by suction.

According to a further feature of my invention, the gas pressure is further utilized to aid in loading the successive wafers from conveyor means on to the table and in unloading the tested wafers from the table back to the same conveyor means, the latter being adapted to transport the wafers to and away from the table. The system of conduits for the application of the gas under pressure to the wafers and the exertion of suction thereon is provided with solenoid valves which are under the control of a common control circuit associated with the photoelectric sensing means. It is therefore easy to automate the complete process of loading, orienting and unloading the wafers.

The above and other objects, features and advantages of my invention and the manner of attaining them will become more readily apparent, and the invention itself will best be understood, from the following description taken in connection with the accompanying drawings showing some preferred embodiments of my invention.

DESCRIPTION OF THE PREFERRED EMBODIMENTS

Figure 1:
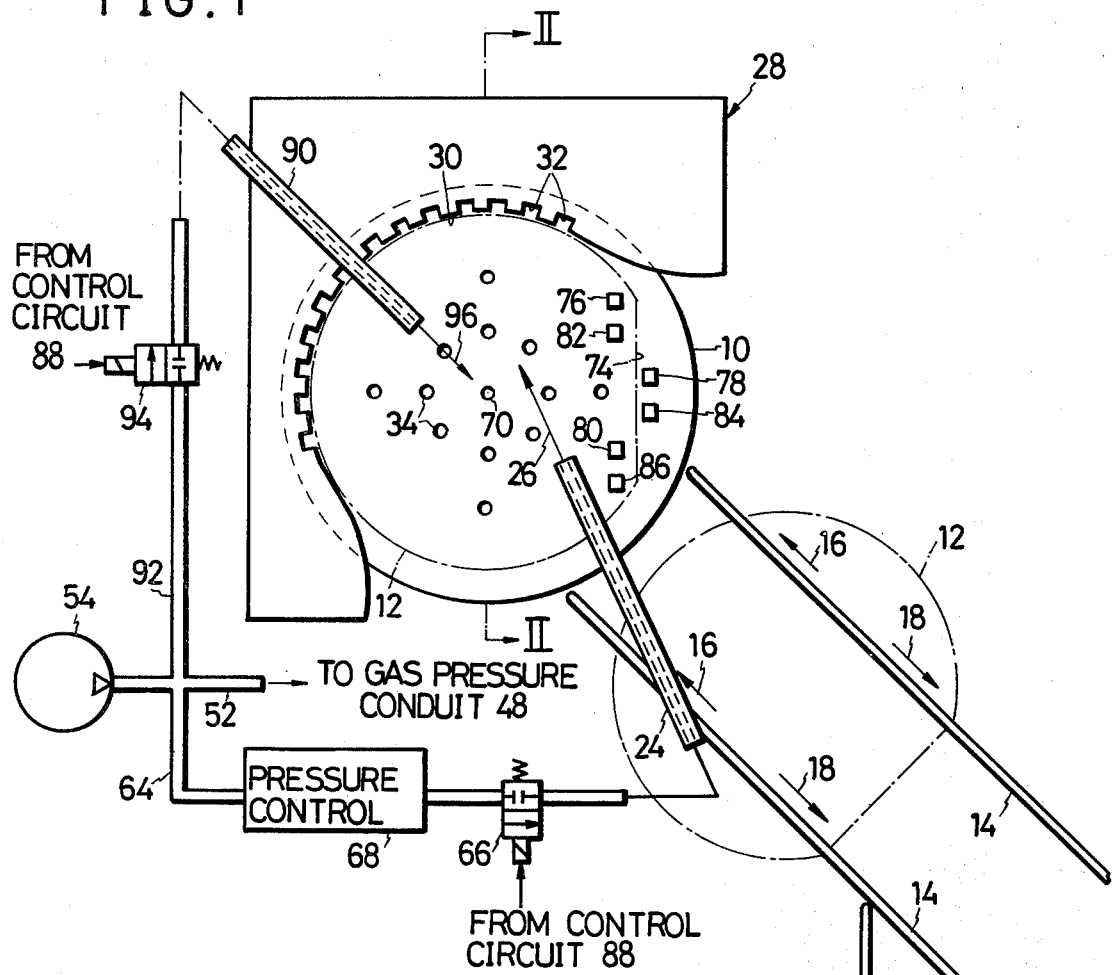
FIG. 1 is a schematic, partial plan view of a preferred form of the wafer prober constructed in accordance with the principles of my invention.
Figure 2:
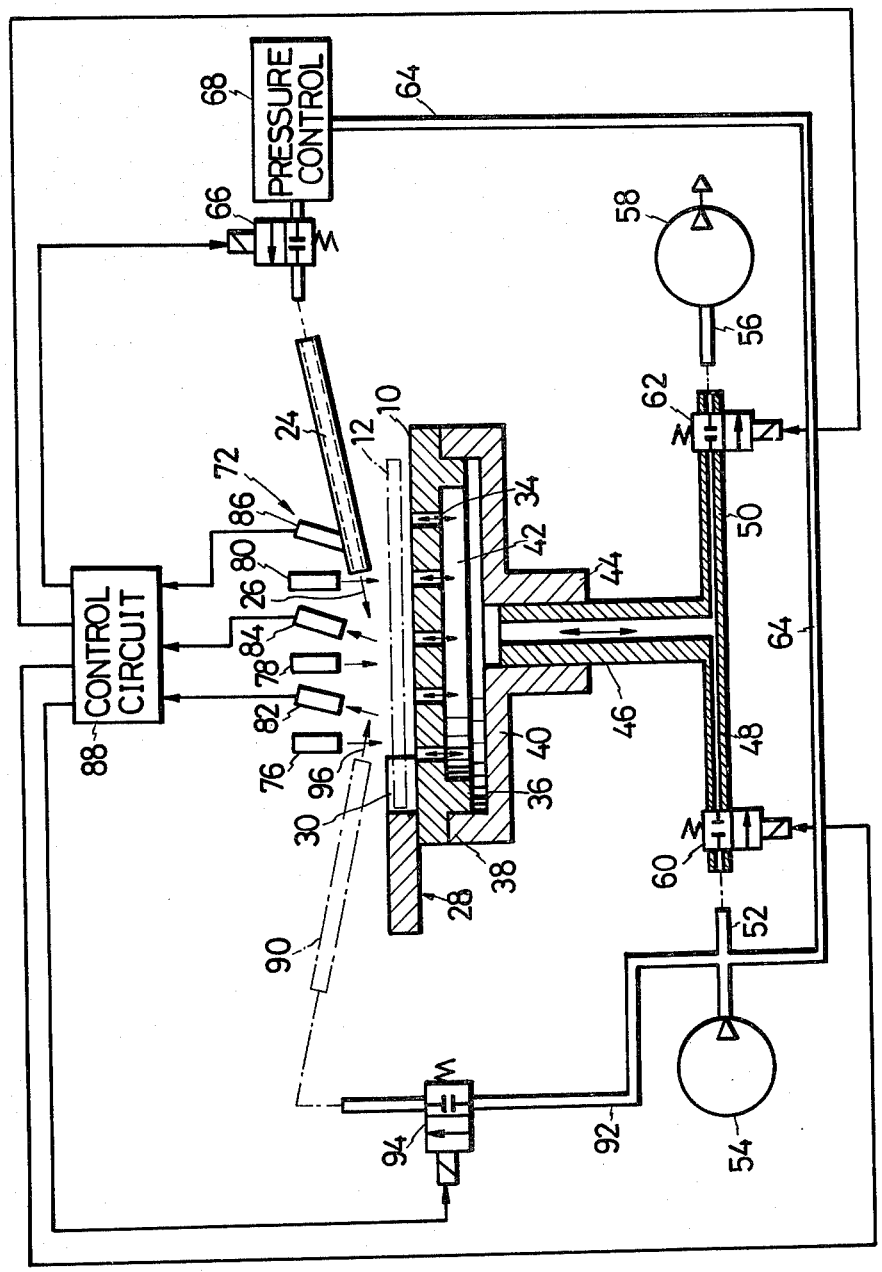
FIG. 2 is a vertical sectional view taken along the line II—II of FIG. 1, the figure also showing in detail the electrical and pneumatic circuits used for correctly orienting wafers to be tested on the table of the prober.

With reference first and in particular to FIGS. 1 and 2 of the drawings, which illustrate the first preferred embodiment of my invention, there is shown at 10 a metal-made table, or turntable, of disclike shape. Semiconductor wafers 12 to be tested, having integrated circuits or the like fabricated within and upon themselves, are to be loaded one at a time on the table 10 and oriented in a predetermined angular position thereon in accordance with my invention. The table 10 is to be both rotated about its own axis and moved in any of X, Y and Z directions, each perpendicular to the other two, by means well known to the specialists and therefore not shown in the drawings.

For transporting the successive wafers to be tested to, and the tested wafers away from, the table 10, there is provided a loading/unloading conveyor 14 comprising a pair of endless belts, preferably of rubber, that extend in parallel spaced relationship to each other and in substantially coplanar relationship to the table 10. The loading/unloading conveyor 14 is reversible in the direction of its motion, traveling in the direction of arrows 16 for transporting each wafer 12 to be tested to the table 10 and in the direction of arrows 18 for transporting the tested wafer away from the table.

The transportation of the wafers to and away from the table 10 could be effected solely by the loading/unloading conveyor 14. In the illustrated embodiment, however, another conveyor is provided at 20 for transporting the wafers to be tested from a location different from a place where the tested wafers are accepted and hence for facilitating the sorting of the untested and the tested wafers. The conveyor 20 (hereinafter referred to as the infeed conveyor) is also in the form of a pair of endless belts 20, preferably of rubber. Junctioned to the loading/unloading conveyor 14 as shown in FIG. 1, the infeed conveyor 20 travels only in the direction of arrows 22 for feeding the successive wafers to be tested to the loading/unloading conveyor 14 and thence to the table 10.

The loading/unloading conveyor 14 is effective, however, to only partly load the successive wafers to be tested on the table 10. Some additional means is therefore required for completely loading the wafers on the table. To this end an elongated gas nozzle 24 is disposed above the table 10 for directing a gas (e.g., air or nitrogen) under pressure to the wafer partly loaded on the table, at such an angle that the wafer is moved farther away from the loading/unloading conveyor 14 and on to the table, as indicated by an arrow 26 in FIGS. 1 and 2. The gas nozzle 24 serves the additional, perhaps more important, function of revolving the thus-loaded wafer substantially about its own axis, as will be later described in more detail. The gas nozzle 24 will hereinafter be referred to as the loading/revolving nozzle in view of the dual function it is intended to perform.

Seen at 28 is a wafer stop secured to the table 10 and disposed in a position thereon diametrically opposite to the position where the successive wafers are loaded on the table from the loading/unloading conveyor 14 and unloaded from the former back to the latter. The wafer stop 28 has an arcuate abutment 30. Each wafer loaded on the table 10 is to be urged against or toward this abutment 30 under the pressure of the gas emitted from the loading/revolving nozzle 24. The wafer stop 28 thus serves to stop and hold the loaded wafer in a predetermined position on the table 10, serving as a guide for the wafer as the latter is subsequently revolved relative to the table as aforementioned.

It will be noted from FIG. 1 that the radius of curvature of the arcuate abutment 30 is slightly (e.g., approximately 5%) more than the radius of each wafer 12 to be tested. As will be noted from FIG. 2, moreover, the thickness of the wafer stop 28 is greater than that of the wafer. The arcuate abutment 30 has a series of identations 32 formed therein at constant spacings, for purposes hereinafter referred to.

The wafer 12 loaded and positioned on the table 10 as above could be revolved substantially about its own axis merely as the gas under pressure is applied thereto from the loading/revolving nozzle 24. I prefer, however, to buoy up the wafer from the table surface during its revolution, in order to minimize the stress applied to the wafer. Toward this end, a plurality of gas inlet/outlet holes or openings 34 of comparatively small diameter are formed in the table 10 in suitable relative placement. Such openings have been formed in the tables of conventional wafer probers as well, for the exertion of suction therethrough on the wafer being tested. As the name implies, however, the gas inlet/outlet openings 34 in the table 10 according to my invention are intended not only for the exertion of suction therethrough but also for the application therethrough of a gas under pressure to the wafer so as to buoy up same from the table surface.

The table 10 has a rim 36 formed on its underside. This rim 36 is closely fitted in a rim 38 on a table base 40 which also is of disclike shape. The table 10 and its base 40 coact to substantially pressure-tightly define a plenum/vacuum chamber 42 therebetween. The table base 40 is formed to include a sleeve 44 extending coaxially downwardly therefrom. The sleeve 44 is fitted over a hollow spindle or conduit 46, in such a way that the table 10 and its base 40 are jointly rotatable about the spindle. The interior of the hollow spindle 46 is in open communication with the plenum/vacuum chamber 42.

At its bottom end the hollow spindle 46 bifurcates into a gas pressure conduit 48 and a vacuum conduit 50. The gas pressure conduit 48 is communicatively connected via another conduit 52 to a source 54 of the gas under pressure such as an air compressor or blower. The vacuum conduit 50 is communicatively connected via a further conduit 56 to a vacuum pump 58 or the like. The gas pressure conduit 48 is provided with a solenoid valve 60 for the on-off control of communication between plenum/vacuum chamber 42 and pressurized gas source 54. The vacuum conduit 50 is likewise provided with a solenoid valve 62 for the on-off control of communication between plenum/vacuum chamber 42 and vacuum source 58.

Thus, as the solenoid valve 60 on the gas pressure conduit 48 is opened while the solenoid valve 62 on the vacuum conduit 50 is held closed, the gas under pressure from the source 54 is delivered to the plenum/vacuum chamber 42 by way of the conduits 52 and 48 and the hollow spindle 46. The gas under pressure thus delivered to the plenum/vacuum chamber 42 is of course discharged through the gas inlet/outlet openings 34 in the table 10. The wafer loaded on the table 10 is therefore buoyed up from the table surface. The aforesaid indentations 32 in the arcuate abutment 30 of the wafer stop 28 are intended to permit escape therethrough of part of the gas under pressure thus applied to the wafer through the table openings 34.

The plenum/vacuum chamber 42 is communicated with the vacuum source 58 by way of the hollow spindle 46 and the conduits 50 and 56 as the solenoid valve 62 on the vacuum conduit 50 is opened, with the solenoid valve 60 on the gas pressure conduit 48 closed. The result is the creation of a partial vacuum in the plenum/vacuum chamber 42. This partial vacuum in the chamber 42 is effective to exert suction on the wafer 12 on the table 10, causing adhesion of the former to the latter.

The pressurized gas source 54 can further be placed in communication with the loading/revolving nozzle 24 by way of a conduit 64 having a solenoid valve 66 and pressure control means 68. As clearly seen in FIG. 1, the loading/revolving nozzle 24 is disposed at an angle to the loading/unloading conveyor 14, such that the gas under pressure is delivered in the direction of the arrow 26 from the nozzle 24 to the wafer 12 on the table 10. This arrow marked direction 26 is set off the center 70 of the table 10, which table center substantially agrees with the center of the wafer mounted in position on the table.

As the solenoid valve 60 on the gas pressure conduit 48 and the solenoid valve 66 on the conduit 64 are both opened, therefore, the gas under pressure from the source 54 is applied to the wafer through the gas inlet/outlet openings 34 and the loading/revolving nozzle 24. The wafer is thus buoyed up from the table surface and is simultaneously revolved substantially about its own axis relative to the table as guided by the arcuate abutment 30 of the wafer stop 28.

Figure 3:
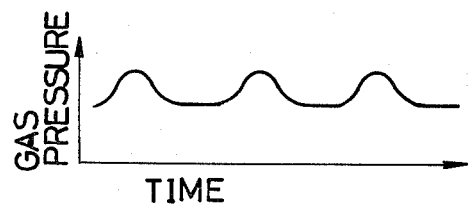
FIG. 3 is a graph plotting the pulsating pressure under which air or other gas is applied to the wafer on the table to cause its smooth revolution substantially about its own axis.

The pressure control means 68 interposed between pressurized gas source 54 and solenoid valve 66 is of prior art design adapted to introduce pulsations in the pressure under which the gas is applied from the loading/revolving nozzle 24 to the wafer on the table 10, as graphically represented in FIG. 3. Such pulsating gas pressure is effective to afford smooth revolution of the wafer relative to the table 10. The reason for this will be explained in further detail in the subsequently presented description of operation.

I contemplate the use of photoelectric means 72 for sensing the fact that the wafer 12, loaded on the table 10 and buoyed up and revolved as above, is properly oriented on the table. For photoelectrically sensing the orientation of the wafer on the table by the means 72, it is necessary that the wafer be recessed circumferentially as indicated at 74 in FIG. 1. The wafer orientation can be sensed from the angular position of this orientation recess 74, as in the following.

The photoelectric sensing means 72 comprises a plurality of light sources such as first 76, second 78 and third 80 light emitting diodes (LED), and a plurality of photodetectors such as first 82, second 84 and third 86 photoresistors. All these constituent elements of the photoelectric sensing means 72 are fixedly supported above the table 10. The first 76, the second 78 and the third 80 LEDs are associated with the first 82, the second 84 and the third 86 phototransistors respectively. The three LEDs are so angled with respect to the table 10 that the beams of light therefrom impinge approximately perpendicularly upon the table or upon the wafer 12 thereon. The three phototransistors are each disposed out of the perpendicular to the plane of the table 10.

For the successful functioning of the above photoelectric sensing means 72, it is essential that the light beams from the LEDs 76, 78 and 80 be scattered about on reflection from the table 10. This objective can be accomplished most satisfactorily by gold-plating and crinkling at least the top surface of the table 10. Upon impingement on this gold-plated and crinkled table surface, the light beams from the LEDs are diffused, and parts of the diffuse light rays inevitably fall on the phototransistors 82, 84 and 86 thereby causing same to generate high electrical outputs.

The above table surface is in contrast to the smooth, nearly mirrorlike surfaces possessed by semiconductor wafers in general. Impinging on the wafer on the table 10, the light beams from the LEDs 76, 78 and 80 are therefore not scattered about but reflected, for example, back to the LEDs. The electrical outputs produced then from the phototransistors 82, 84 and 86 are low.

Figure 4:
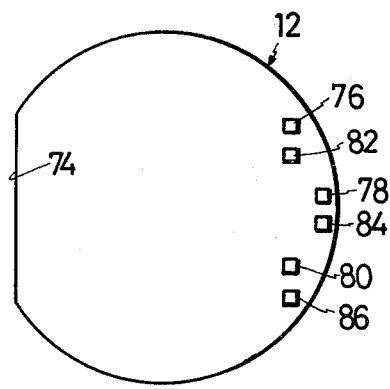
FIG. 4 is a schematic plan view explanatory of the positioning of the photoelectric sensing means of the wafer prober in relation to the wafer mounted in position on the table, the wafer shown in this figure being not correctly oriented.
Figure 5:
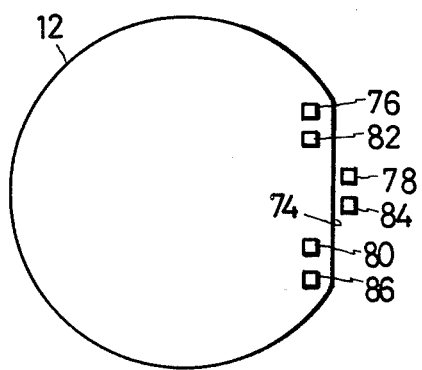
FIG. 5 is a view similar to FIG. 4 except that the wafer is shown correctly oriented with respect to the photoelectric sensing means.

FIGS. 4 and 5 are explanatory of the positions of the three LEDs 76, 78 and 80 and the three phototransistors 82, 84 and 86, in relation to the orientation of the wafer 12 mounted in position on the table 10. The light beams from all the LEDs impinge on the wafer 12 when the orientation recess 74 in the wafer is in an undesired angular position shown, for example, in FIG. 4. When the orientation recess 74 in the wafer is turned to a desired angular position shown in FIG. 5, the light beams from the first 76 and the third 80 LEDs impinge on the wafer, whereas the light beam from the second LED 78 impinges on the table 10. The wafer is properly oriented on the table when the orientation recess therein is turned to the predetermined angular position of FIG. 5. It should be appreciated that the LEDs and phototransistors of the photoelectric sensing means 72 can be disposed conveniently close together because the phototransistors are to be irradiated by the diffuse light rays reflected from the gold-plated and crinkled surface of the table 10.

With reference back to FIG. 2, the phototransistors 82, 84 and 86 of the photoelectric sensing means are all electrically connected at the inputs of a control cicuit 88. This control circuit has its outputs connected to the aforesaid three solenoids on the valves 60, 62 and 66. Although the configuration of the control circuit 88 is not shown in detail because of its rather common and well-known nature, it is understood that the control circuit functions, for instance, to close the solenoid valves 60 and 66 on the gas pressure conduits 48 and 64, and to open the solenoid valve 62 on the vacuum conduit 50, when the proper orientation of the wafer on the table 10 is sensed photoelectrically as above. Other functions of the control circuit 88 will become apparent from the subsequent description of operation.

As shown in both FIGS. 1 and 2, the pressurized gas source 54 can further be placed in and out of communication with a second or unloading nozzle 90 by way of a conduit 92 having a solenoid valve 94. Also electrically connected to the control circuit 88, the solenoid valve 94 is intended to be opened upon completion of the testing of each of the successive wafers on the table 10. The unloading nozzle 90 emits the gas under pressure from the source 54 in the direction indicated by an arrow 96 in FIGS. 1 and 2 when the solenoid valve 94 is opened. The gas pressure provided by the unloading nozzle 90 is effective to help unload the tested wafer from the table 10 back to the loading/unloading conveyor 14.

OPERATION

Although the operation of the wafer prober shown in FIGS. 1 and 2 is believed to be apparent from the foregoing, further amplification will be made in the following summary of such operation. The semiconductor wafer 12 to be tested may be deposited automatically on the infeed conveyor 22 by suitable means, not shown, and is thereby transported to and placed on the loading/unloading conveyor 14. This loading/unloading conveyor is now assumed to be traveling in its forward or loading direction indicated by the arrows 16, so that the wafer is thereby further transported to and loaded partly on the table 10.

During the loading and subsequent orienting of the wafer on the table 10, the solenoid valves 60 and 66 are opened, and the solenoid valves 62 and 94 closed, under the control of the control circuit 88. The loading/unloading conveyor 14 by itself is capable of only partly loading the wafer on the table 10. The wafer can be completely moved on the table, however, as then the gas under pressure is applied thereto in the direction of the arrow 26 from the loading/revolving nozzle 24.

The wafer is buoyed up, at least partly, from the table surface during its travel toward the arcuate abutment 30 of the wafer stop 28 by the gas under pressure blown upwardly through the gas inlet/outlet openings 34 in the table. Upon contact with the abutment 30, the floating wafer starts revolving substantially about its own axis under the pressure of the gas from the loading/revolving nozzle 24.

The floating wafer 12 is revolved as above in sliding contact with the abutment 30, the latter now functioning as a guide. Since this abutment has the series of indentations 32 formed therein, part of the gas emitted from the gas inlet/outlet openings 34 in the table 10 to buoy up the wafer is allowed to escape upwardly through the abutment indentations. The wafer can therefore be maintained substantially parallel to the surface of the table 10 during its revolution relative to the latter.

It will be recalled that the pressure control means 68 is interposed between pressurized gas source 54 and loading/revolving nozzle 24 in order to introduce pulsations in the pressure under which the gas is applied from the nozzle to the wafer. Were it not for this pressure control means 68, equilibrium might be attained between the gas pressure applied to the wafer to cause its revolution and the forces opposing such revolution of the wafer, thus bringing the wafer to a standstill. In practice such equilibrium will not be attained, or will be readily broken, by virtue of the pulsating gas pressure graphically represented in FIG. 3. The wafer can therefore be revolved smoothly over the table.

With the floating wafer 12 thus revolved smoothly, the orientation recess 74 therein is turned, sooner or later, to the predetermined angular position of FIG. 5. This correct orientation of the wafer on the table 10 can be invariably realized before the wafer makes one complete revolution. When the orientation recess 74 in the wafer is turned to the predetermined angular position of FIG. 5, the light beams from the first 76 and the third 80 LEDs of the photoelectric sensing means 72 impinge on the smooth surface of the wafer, and the light beam from the second LED 78 impinges on the gold-plated and crinkled surface of the table 10. As a consequence, low electrical outputs are produced by the first 82 and the third 86 phototransistors, and a high electrical output is produced by the second phototransistor 84.

The control circuit 88 responds to these outputs from the three phototransistors 82, 84 and 86 to close the solenoid valves 60 and 66 on the gas pressure conduits 48 and 64 and to open the solenoid valve 62 on the vacuum conduit 50. The emission of the gas under pressure from the gas inlet/outlet openings 34 and from the loading/revolving nozzle 24 is now terminated. The properly oriented wafer is therefore allowed to fall by gravity on the table 10 with its angular orientation substantially unchanged. The wafer is further caused to adhere firmly to the table 10 by suction exerted thereon by the vacuum source 58 through the gas inlet/outlet openings 34.

The wafer may be slightly angularly displaced from its position of proper orientation by inertia and/or because of a delay in the closure of the solenoid valves 60 and 66 on the gas pressure conduits 48 and 64. Such slight angular displacement of the wafer is usually negligible for practical purposes. If desired, however, the position of proper orientation for the wafer may be determined with its additional slight angular displacement taken into account.

After the wafer is properly oriented and adhered to the table 10 through the foregoing precedure, the table may be moved under the probes, not shown, if necessary. Such movement of the table is of course unnecessary if the probes are disposed just over the table. In this latter case the position of the wafer relative to the probes may be immediately finely adjusted as required by moving the table. The fine adjustment of the wafer position relative to the probes will be easy because the wafer is properly oriented on the table. The integrated circuits or electronic devices fabricated within and upon the wafer can now be tested with the probes in the manner well known to those skilled in the art.

Upon completion of the testing of the wafer, the solenoid valve 62 on the vacuum conduit 50 is closed by the control circuit 88 in order to terminate the exertion of suction on the wafer. The solenoid valves 60 and 94 on the gas pressure conduits 48 and 92 are then opened by the control circuit 88 in order to buoy up the tested wafer from the table surface and to move the wafer toward the loading/unloading conveyor 14. This conveyor 14 is now being driven in the direction of the arrows 18 in FIG. 1. As the buoyed wafer 12 is moved to and rides partly over the loading/unloading conveyor 14 by the gas under pressure applied thereto from the unloading nozzle 90 in the direction of the arrow 96, the wafer can be unloaded from the table 10 by the conveyor, thereby to be transported to the location where the tested wafer is received.

The above cycle of operation is repeated to test the successive wafers. It will be seen that the operating cycles can be automated to increase the throughput of the wafer prober.

SECOND EMBODIMENT

Another preferred embodiment of my invention will now be described with reference to FIGS. 6 through 8. In these figures, most parts of this second embodiment are identified by the same reference characters as those used to denote the corresponding parts of the preceding embodiment in FIGS. 1 and 2. The description of all such parts having their corresponding parts in the FIGS. 1 and 2 embodiment will be omitted.

Figure 7:
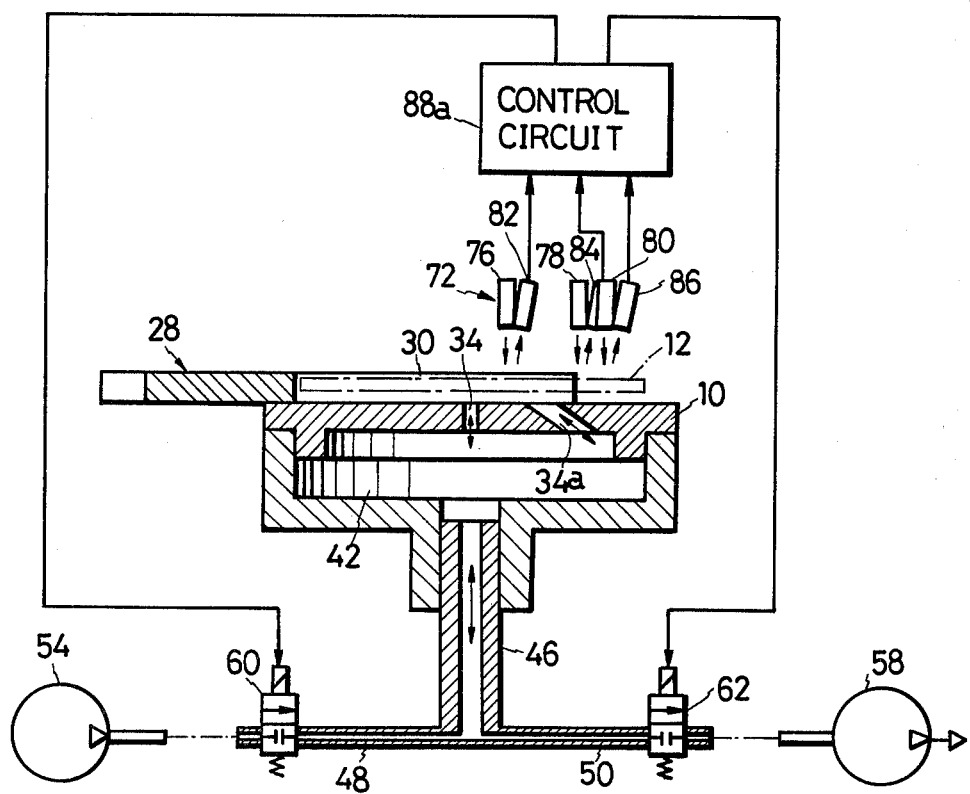
FIG. 7 is a vertical sectional view taken along the line VII—VII of FIG. 6, the figure also showing in detail the electrical and pneumatic circuits for correctly orienting the wafer on the table.
Figure 6:
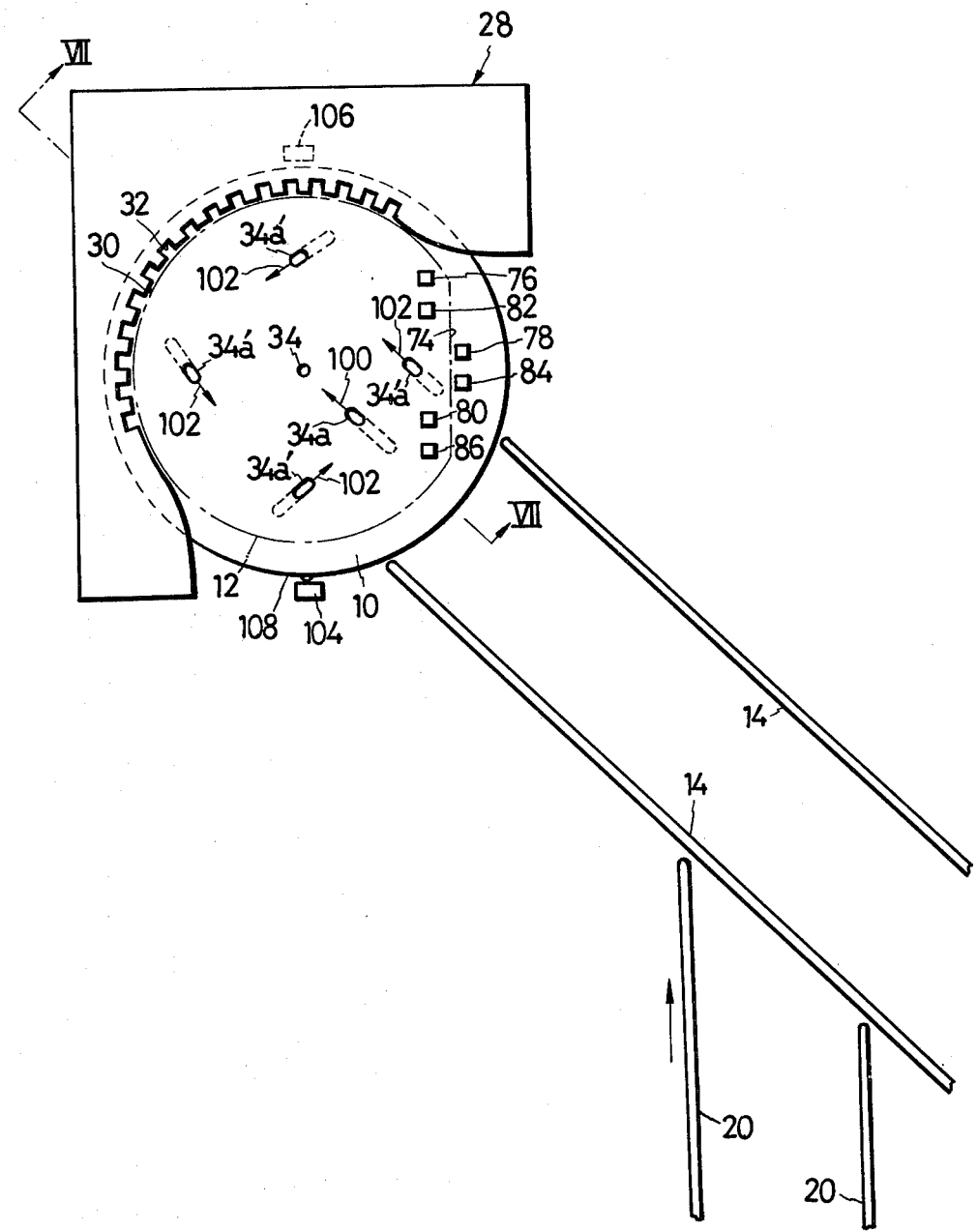
FIG. 6 is a schematic, partial plan view of another preferred embodiment of my invention, showing the wafer just loaded in position on the table from the conveyor means.
Figure 8:
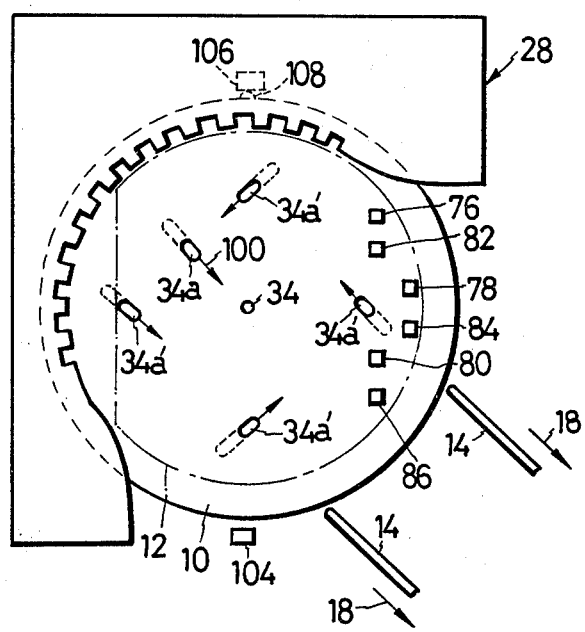
FIG. 8 is a partial plan view somewhat similar to FIG. 6 except that the table is shown turned 180 degrees from its angular position of FIG. 6 for unloading the tested wafer from the table back to the conveyor means.

This FIGS. 6 through 8 embodiment differs from that of FIGS. 1 and 2 in that the former has no loading-/revolving nozzle or unloading nozzle. The functions of these nozzles are performed by modified gas inlet/outlet openings 34a and 34a' formed in the table 10. Of the several gas inlet/outlet openings in the table 10, only the centrally located one extends vertically therethrough just like the table openings in the FIGS. 1 and 2 embodiment and is therefore designated 34.

All the other gas inlet/outlet openings in the table 10 extend at angles to the plane of the table. Of these modified gas inlet/outlet openings, the opening 34a is so angled that the gas under pressure is emitted therefrom in the direction of an arrow 100 in FIGS. 6 and 8 to aid in loading and unloading the successive wafers 12 on and from the table 10. The other modified gas inlet/outlet openings 34a' are so angled that the gas under pressure is emitted therefrom in the directions of arrows 102 in FIG. 6 for revolving the wafer substantially about its own axis over the table. It will be evident that all these modified gas inlet/outlet openings 34a and 34a', and of course the central opening 34, are also effective to buoy up the wafer from the table 10 by the gas under pressure emitted therefrom, and further to cause adhesion of the wafer to the table by suction exerted through the openings.

A consideration of FIGS. 6 and 8 will show that there is an angular difference of 180 degrees between the FIG. 6 position of the table 10 for loading the wafer thereon and the FIG. 8 position of the table for unloading the wafer therefrom. This is to aid in loading and unloading the wafer on and from the table with the gas under pressure discharged from the same gas inlet/outlet opening 34a. In order to maintain the table in the loading position of FIG. 6 and the unloading position of FIG. 8, first 104 and second 106 table position sensing switches are fixedly mounted in diametrically opposite positions across the table. A switch actuator 108 is mounted on the perimeter of the table for actuating the first 104 and the second 106 table position sensing switches, as will be explained in more detail in the following description of operation.

For loading the wafer 12 to be tested on the table 10 in this second embodiment of my invention, the solenoid valve 62 on the vacuum conduit 50 is closed, and the solenoid valve 60 on the gas pressure conduit 48 opened, under the control of the control circuit 88a.

The table 10 must be held in the loading position of FIG. 6, with the switch actuator 108 thereon in engagement with the first table position sensing switch 104. The gas under pressure from the source 54 is blown out of all the gas inlet/outlet openings 34, 34a and 34a' in the table in the directions of the arrows 100 and 102 in FIG. 6.

The wafer loaded partly on the table 10 by the loading/unloading conveyor 14 as in the FIGS. 1 and 2 embodiment is then fed toward the wafer stop 28 by the gas under pressure emitted primarily from the table opening 34a. The wafer being thus fed toward the wafer stop 28 is buoyed up from the table by the gas under pressure emitted from some or all of the table openings 34, 34a and 34a'. Thus loaded completely on the table 10, the floating wafer starts revolving substantially about its own axis in sliding contact with the arcuate abutment 30 of the wafer stop 28, as then the gas under pressure is applied to the wafer in the directions of the arrows 102 from the table openings 34a'.

As in the FIGS. 1 and 2 embodiment, the photoelectric sensing means 72 comprising the three LEDs 76, 78 and 80 and the three phototransistors 82, 84 and 86 functions to sense the fact that the orientation recess 74 in the wafer is turned to the predetermined angular position on the table 10. Thereupon the solenoid valve 60 on the gas pressure conduit 48 is closed, and the solenoid valve 62 on the vacuum conduit 50 opened, under the control of the control circuit 88a. The wafer, now properly oriented on the table, is then caused to adhere thereto by suction exerted through all the table openings 34, 34a and 34a'.

The table 10 is turned, either automatically or on manual actuation, from the loading position of FIG. 6 to the unloading position of FIG. 8 upon completion of the testing of the wafer thereon. The turning motion of the table 10 is to be arrested in the precise unloading position as then the switch actuator 108 on the table engages the second table position sensing switch 106 as shown in FIG. 8. Then, with the solenoid valve 62 on the vacuum conduit 50 closed, the solenoid valve 60 on the gas pressure conduit 48 is opened again, thereby buoying up the tested wafer from the table and moving the wafer on to the loading/unloading conveyor 14. This conveyor is now being driven in the unloading direction of the arrows 18. The wafer partly placed on the conveyor 14 by the gas under pressure emitted primarily from the table opening 34a can be completely unloaded from the table by the conveyor.

This FIGS. 6 through 8 embodiment agrees with that of FIGS. 1 and 2 in that each wafer is oriented pneumatically in the desired angular position on the table 10 and that its orientation is sensed photoelectrically. One of the most pronounced features of the FIGS. 6 through 8 embodiment resides in the fact that the gas pressure is applied only from under the wafer for loading, orienting and unloading same. This feature is advantageous in that the marking ink is not to be scattered about by the gas pressure.

MODIFICATION

Figure 9:
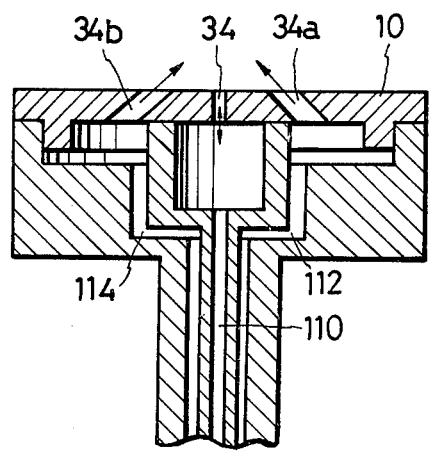
FIG. 9 is an axial sectional view of a table and associated means constituting a slight modification of the embodiment of FIGS. 6 through 8.

FIG. 9 shows a slight modification of the FIGS. 6 through 8 embodiment, which modification has an additional opening 34b formed in the table 10 for use solely in unloading the tested wafer from the table. This additional table opening 34b is angularly spaced 180 degrees from the opening 34a about the axis of the table. The table opening 34a in this modification is used only for completely loading the wafer on the table. The table 10 can therefore be maintained in the same angular position when the wafer is loaded thereon and when the wafer is unloaded therefrom, provided that the table is not turned through any great angle in finely adjusting the position of the wafer thereon relative to the probes.

Also formed in the table 10 are the centrally located opening 34 and other openings, seen at 34a' in FIGS. 6 and 8 but not in FIG. 9, that serve to buoy up and revolve the wafer. All these table openings 34 and 34a' are in open communication with a passageway 110 which can be placed in and out of communication with the pressurized gas source, seen at 54 in FIGS. 1, 2 and 7, by a solenoid valve (not shown).

The other two table openings 34a and 34b are in open communication with passageways 112 and 114 which can be placed in and out of communication with the pressurized gas source 54 by solenoid valves (not shown), respectively. At least the passageway 110 can further be placed in and out of communication with the vacuum source, seen at 58 in FIGS. 2 and 7, by a solenoid valve (not shown). All the noted solenoid valves are of course under the control of a control circuit similar to the control circuits 88 and 88a of the preceding embodiments.

In operation, for loading and orienting the wafer, the passageways 110 and 112 are placed in communication with the pressurized gas source thereby causing emission of the gas under pressure from the table openings 34, 34a and 34a'. For unloading the wafer after the testing thereof, the passageways 110 and 114 are placed in communication with the pressurized gas source thereby causing emission of the gas under pressure from the table openings 34, 34a' and 34b. Other details of construction and operation of this modified wafer prober will be apparent from the description of the previous embodiments.

Although I have shown and described my invention in terms of what I consider to be preferable embodiments thereof, it is to be understood that these embodiments are by way of example only and not to impose limitations on the invention, since numerous modifications thereof will readily occur to those skilled in the art. For example, lasers or similar light sources may be employed instead of the LEDs of the photoelectric sensing means, and photodiodes may be employed instead of the phototransistors. Further, the numbers of the various openings in the table may be increased or decreased, and two or more loading/revolving nozzles and unloading nozzles may be provided, as desired or required.

All these and other modifications and changes within the common knowledge of the specialists are intended in the foregoing disclosure. It is therefore appropriate that my invention be construed broadly and in a manner consistent with the fair meaning or proper scope of the following claims.

What I claim is:

1. In apparatus for testing integrated circuits or the like fabricated within and upon semiconductor wafers each having an orientation recess formed therein, in combination:
   (a) a table having a wafer mounting surface on which the wafers are loaded one at a time and which is gold-plated and crinkled to diffusedly reflect light falling thereon;
   (b) means for holding the loaded wafer in a predetermined position on the table;
   (c) means for revolving the loaded wafer substantially about its own axis relative to the table by application of a gas under pressure;
   (d) light source means for irradiating the wafer being revolved or the wafer mounting surface of the table depending upon the angular position of the orientation recess in the wafer;
   (e) photodetector means responsive only to the light emitted from the light source means and reflected diffusedly from the wafer mounting surface of the table and so capable of sensing the fact that the orientation recess in the wafer is turned to a predetermined angular position on the table, the photodetector means being operatively associated with the revolving means for causing same to terminate the application of the gas under pressure to the wafer when the orientation recess therein is turned to the predetermined angular position on the table; and
   (f) means operatively associated with the photodetector means for adhering the wafer to the table by suction when the orientation recess in the wafer is turned to the predetermined angular position on the table.

2. The apparatus as set forth in claim 1, wherein the table has a plurality of openings formed therein, and wherein the revolving means comprises:
   (a) means for blowing the gas under pressure through the openings in the table so as to buoy up the wafer loaded thereon; and
   (b) means for applying the gas under pressure to the wafer from above, in such a direction that the wafer is revolved substantially about its own axis while being held buoyed up from the table.

3. The apparatus as set forth in claim 2, wherein the revolving means further comprises means for periodically varying the pressure of the gas applied to the wafer to revolve same.

4. The apparatus as set forth in claim 2, wherein the adhering means is adapted to exert suction on the wafer through the openings in the table.

5. The apparatus as set forth in claim 2, wherein the holding means includes an arcuate abutment adapted to make relative sliding contact with the wafer when the latter is being revolved, the abutment having formed therein a series of indentations adapted to permit escape therethrough of part of the gas under pressure blown through the openings in the table.

6. The apparatus as set forth in claim 1, wherein the table has a plurality of openings formed therein, and wherein the revolving means comprises:
   (a) means for blowing the gas under pressure through the openings in the table;
   (b) at least some of the openings in the table being so angled that the wafer loaded thereon is both buoyed up and revolved substantially about its own axis by the gas under pressure blown therethrough.

7. The apparatus as set forth in claim 6, wherein the adhering means is adapted to exert suction on the wafer through the openings in the table.

8. The apparatus as set forth in claim 6, wherein the holding means includes an abutment adapted to make relative sliding contact with the wafer when the latter is being revolved, the abutment having formed therein a series of indentations adapted to permit escape therethrough of part of the gas under pressure blown through the openings in the table.

9. In apparatus for testing integrated circuits or the like fabricated within and upon semiconductor wafers each having an orientation recess formed therein, in combination:

(a) a table having a wafer mounting surface which is gold-plated and crinkled to diffusedly reflect light falling thereon;

(b) conveyor means for transporting and partly loading the wafers on the wafer mounting surface of the table one at a time;

(c) means for applying a gas under pressure to the partly loaded wafer so as to completely load same on the wafer mounting surface of the table;

(d) means for holding the loaded wafer in a predetermined position on the table;

(e) the gas-applying means being further capable of buoying up the loaded wafer from the wafer mounting surface of the table and of revolving the buoyed wafer substantially about its own axis relative to the table;

(f) light source means for irradiating the wafer being revolved or the wafer mounting surface of the table depending upon the angular position of the orientation recess in the wafer;

(g) photodetector means responsive only to the light emitted from the light source means and reflected diffusedly from the wafer mounting surface of the table and so capable of sensing the fact that the orientation recess in the wafer is turned to a predetermined angular position on the table, the photodetector means being operatively associated with the gas-applying means for causing same to terminate the application of the gas under pressure to the wafer when the orientation recess therein is turned to the predetermined angular position on the table; and (h) means operatively associated with the photodetector means for adhering the wafer to the table by suction when the orientation recess in the wafer is turned to the predetermined angular position on the table.

10. The apparatus as set forth in claim 9, wherein the conveyor means is further adapted to transport the tested wafer away from the table, and wherein the gas-applying means is further adapted to help unload the tested wafer from the table back to the conveyor means.

11. The apparatus as set forth in claim 10, wherein the table has formed therein a plurality of openings through which the gas under pressure is applied to the loaded wafer for buoying up same, and wherein the gas-applying means further comprises:

(a) a first nozzle for directing the gas under pressure to the wafer so as to completely load same from the conveyor means on to the table and further to revolve the loaded and buoyed wafer relative to the table; and (b) a second nozzle for directing the gas under pressure to the wafer, following the testing thereof, so as to help unload the wafer from the table back to the conveyor means.

12. The apparatus as set forth in claim 9, wherein the table has formed therein a plurality of openings through which the gas under pressure is blown by the gas-applying means, at least one of the openings in the table being so angled that the wafer partly loaded thereon from the conveyor means is completely loaded thereon by the gas under pressure blown through said at least one of the openings, the other openings in the table being so angled that the wafer is both buoyed up and revolved relative to the table by the gas under pressure blown therethrough.

13. The apparatus as set forth in claim 12, wherein the conveyor means is further adapted to transport the tested wafer away from the table, and wherein the table is adapted to be turned 180 degrees about is own axis when the tested wafer is to be unloaded therefrom, whereby the tested wafer is unloaded from the table back to the conveyor means at least partly by the gas under pressure blown through said at least one of the openings in the table.

14. The apparatus as set forth in claim 9, wherein the conveyor means is further adapted to transport the tested wafer away from the table, and wherein the openings in the table further include at least one other which is so angled that the tested wafer is unloaded from the table back to the conveyor means at least partly by the gas under pressure blown through said at least one other opening.

* * * * *